United States Patent [19]

Curcio

[11] 4,048,523

[45] Sept. 13, 1977

[54] ELECTRONIC FILTER WITH ACTIVE ELEMENTS

[75] Inventor: Joseph John Curcio, Boalsburg, Pa.

[73] Assignee: Paoli High Fidelity Consultants Inc., Paoli, Pa.

[21] Appl. No.: 728,786

[22] Filed: Oct. 1, 1976

[51] Int. Cl.[2] .......................... H03K 1/02; H03K 1/12

[52] U.S. Cl. .................................... 307/297; 307/318; 328/167; 330/109; 323/3

[58] Field of Search ........................ 307/297, 318, 230; 328/167; 323/3, 1; 330/109

[56] References Cited

U.S. PATENT DOCUMENTS

| | | | |
|---|---|---|---|
| 3,593,113 | 7/1971 | Wiley | 328/167 X |
| 3,602,799 | 8/1971 | Guillen | 307/297 X |

*Primary Examiner*—John S. Heyman
*Attorney, Agent, or Firm*—Gary V. Pack

[57] ABSTRACT

An electronic filter having active components for eliminating A.C. signals, and for producing constant D.C. voltage at its output, wherein the filter can be effectively used between the D.C. power supply and the B+ terminal for an audio amplifier, especially one having vacuum tubes for its major active elements. The electronic filter monitors its output voltage to control the conductivity of a transistor which maintains the output voltage constant. Bias current and voltage requirements for the filter elements are generated internally from the filter input, and are also referenced to the filter output to provide a constant D.C. output over load variations.

7 Claims, 1 Drawing Figure

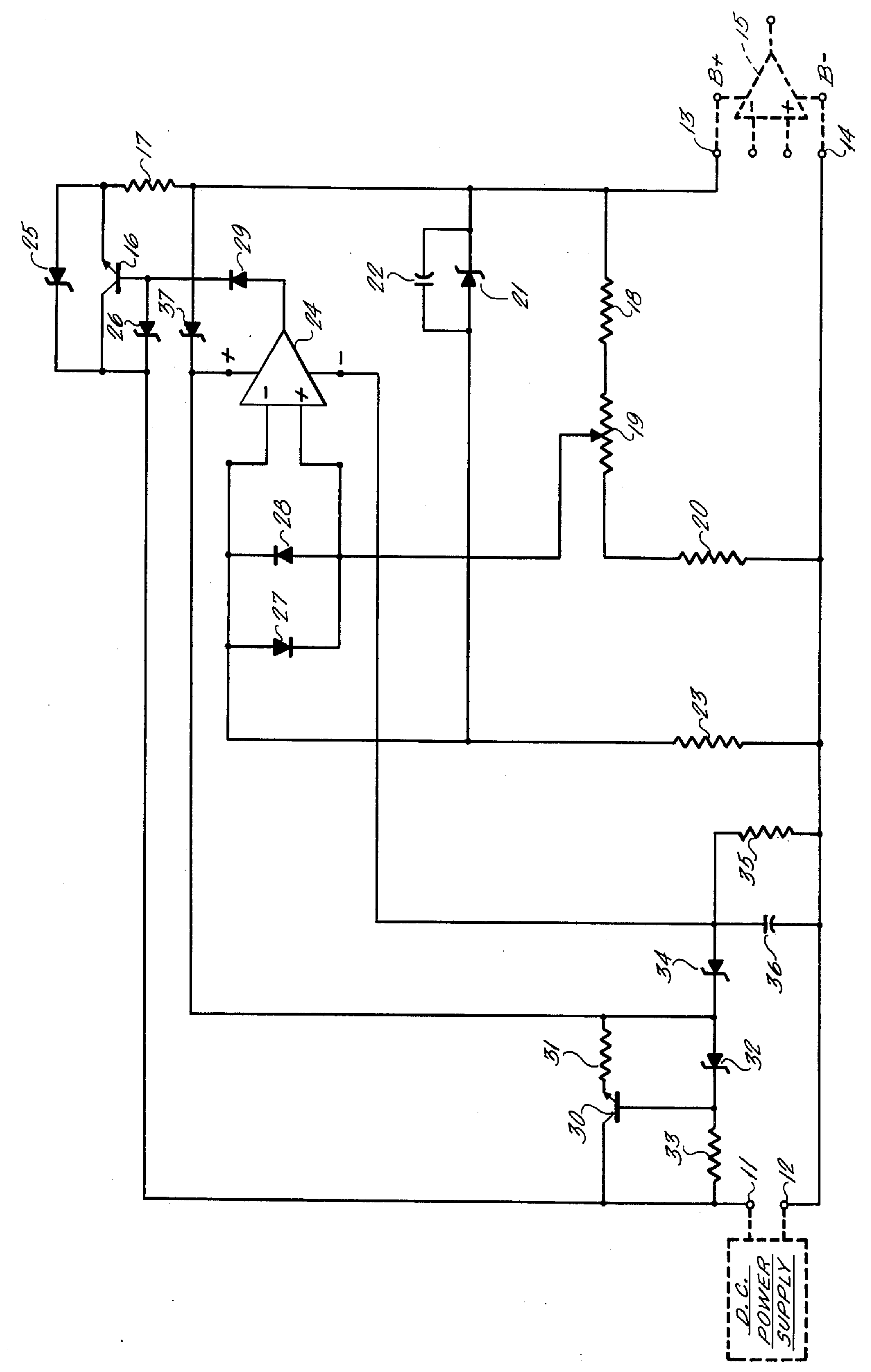
B+
B-
D.C.
POWER
SUPPLY

ELECTRONIC FILTER WITH ACTIVE ELEMENTS

BACKGROUND OF THE INVENTION

This invention is related to the filters for eliminating D.C. power supply ripple and other A.C. signals in the D.C. power supply lines, and more specifically to filters having active elements as well as those filters which generate the necessary power for their elements In an audio amplifier, different audio signals exist at different points within the amplifier circuit at any one point in time. If these separate audio signals are allowed to meet at some point in the circuit, they combine into a complex signal. This complex signal reaches the main signal path in the amplifier and is eventually heard as part of the actual output from the speakers, thereby resulting in an output signal which is not a true representation of the original input signal. This quality of signal reproduction is usually not satisfactory, especially for the perfectionist in high fidelity sound systems.

Fortunately, there are generally only two places in an amplifier where this mixing of the different audio signals occurs. The first mixing location is at the system ground and can be eliminated in a generally acceptable manner by providing a common grounding point on the amplifier chassis for the various individual circuit systems.

The second place within an amplifier where mixing can occur is the D.C. power supply line, or B+ voltage supply line. The usual technique for solving this problem is to use an electrolytic capacitor as a filter for the power supply ripple, which is around 120 Hz. Electrolytic capacitors are adequate for eliminating ripple frequency, but are not usually adequate for removing higher frequencies from the D.C. power supply lines because to build such a capacitor is virtually a physical impossibility In addition, the D.C. power supply should be designed to provide a constant output voltage, even as the load of the amplifier circuit varies. A filter connected to the D.C. power supply output, which monitors the output voltage and automatically adjusts it to a predetermined level, can help provide a constant output voltage despite variances in load and input voltages.

SUMMARY OF THE INVENTION

In accordance with a preferred embodiment, an electronic filter is provided for eliminating the A.C. components in the D.C. power supply line for the B+ power supply in an audio amplifier and to also maintain a nearly constant D.C. voltage level at the filter output. The electronic filter includes a high gain amplifier receiving positive and negative feedback from the filter output with the amplifier output controlling the conductance of the D.C. power supply current through a transistor, and consequently the output voltage for the filter.

The bias voltages and current for the active elements in the filter are generated within the filter itself from the input power received from the D.C. power supply. Additionally, the bias voltages are referenced to the filter output voltage to improve the response of the filter by allowing the bias levels to follow the output voltage over a wide range. This arrangement also eliminates the need for additional power supplies, thereby reducing the overall cost of the filter components as well as the cost of operation.

The net result of the filter is an output voltage with virtually a constant value wherein any audio frequency in the range of 5 to 50,000 Hz has been eliminated. When using the filter in conjunction with a high quality amplifier, especially one using vacuum tubes as its major active elements, the result will be a much clearer, more defined sound in the bass range as well as in the higher ranges.

A better understanding of the invention and its operation will become apparent in the detailed description of the invention.

DESCRIPTION OF THE FIGURE AND PREFERRED EMBODIMENT

The FIGURE is a circuit diagram of the preferred embodiment of the invention.

The electronic filter receives the output of D.C. power supply 10 on its input terminals 11 and 12, with terminal 11 being the positive terminal and terminal 12 being the negative terminal or ground.

The output of the filter appears across output terminals 13 and 14, with terminal 13 being the positive terminal which is maintained at the desired B+ voltage level, and terminal 14 being the negative or ground terminal. An amplifier 15 can be connected to output terminals 13 and 14 as illustrated in the figure.

The output voltage of the filter on terminal 13 is regulated by transistor 16, which controls the flow of current through its collector and emitter. As the current flow through transistor 16 is varied, the current in the path to ground, resistor 17 plus the combination of resistor 18, potentiometer 19, and resistor 20 with zener diode 21, capacitor 22, and resistor 23, necessarily varies, causing the voltage at output terminal 13 to change accordingly, thereby producing a differential output. It is therefore necessary for the amplifier 24 to continuously adjust the conductance of transistor 16 to maintain a constant output voltage on terminal 13, while other variables, such as the load, vary.

A high gain amplifier 24 is connected to the base of transistor 16 to control its conductance. Positive and negative feedback loops from output terminal 13 are connected to amplifier 24 to provide a reference source and error sensing. The positive feedback loop includes resistor 18 and potentiometer 19 and has greater impedance than the negative feedback loop, which includes zener diode 21 and capacitor 22, to maintain circuit stability. During normal operation, a change in the voltage at output terminal 13 is thereby sensed by amplifier 24, which in turn changes the conductance of transistor 16. The resulting change in current flow through transistor 16 brings the voltage on output terminal 13 back to its desired level.

More specifically, the feedback loops are selected so that the positive feedback is only 20 to 30 percent of the negative feedback, to assure that amplifier 24 will remain stable over the anticipated range of output voltages on terminal 13. In addition, the gain of amplifier 24 is preferably quite high, in range of $10^4$ or $10^5$, so that optimum sensitivity to changes in the output voltage is obtained.

Assuming a particular voltage level is desired for the B+ voltage, a particular voltage level will be applied to the base of transistor 16 to accomplish this result. A slight change is immediately sensed by amplifier 24 through the feedback loops, and corrects the output voltage by altering the voltage level on the base of transistor 16. If the output voltage drops because of an increased load on amplifier 15 or because of an A.C. component in the voltage, the voltage of each feedback signal at amplifier 24 also decreases. Because of the different impedances of the feedback loops, as the output voltage decreases, the voltage difference between the two feedback signals decreases. The result is a decreased voltage on the base of transistor 16, which increases the conductance of transistor 16, thereby permitting more current to flow, which brings the output voltage back to its desired level. The opposite situation would occur in the event the output voltage level increased.

With respect to transistor 16, junction protection during startup and its proper bias voltages are supplied by zener diodes 25 and 26. Diodes 27, 28, and 29 are provided for protecting amplifier 24 when the filter first receives power to obtain proper polarity on its terminals.

In the negative feedback path, zener diode 21 helps provide a direct, low impedance return path as well as to maintain the proper voltage differential between the two feedback loops. Capacitor 22, which is connected in parallel with zener diode 21, helps to reduce the noise generated by zener diode 21 as well as to improve its response to voltage changes at output terminal 13.

The elements of the electronic filter for providing bias voltage and current to filter 24 will now be discussed. The current and voltage requirements for the electronic filter are internally generated. Transistor 30 serves as a current source for amplifier 24, with its emitter connected to the positive bias voltage terminal for the amplifier (designated by a "plus" sign), through resistor 31. Zener diode 32 and resistor 33 maintain the proper voltage differentials between the base and collector for operating transistor 30, and across resistor 31 to provide the proper output current level from the current source. Zener diode 34 maintains a constant voltage differential between the positive and negative bias voltages. Resistor 35 acts as a current sink to control the voltage level of the negative bias voltage for amplifier 24, with capacitor 36 serving as an A.C. ground for the bias voltage supply.

To maximize the filter performance, preferably the positive bias voltage is referenced to the filter output terminal through zener diode 37. Therefore, as the filter output voltage increases on output terminal 13, the bias voltage increases, thereby providing the additional operating power needed by amplifier 24 to adjust the conductance of transistor 16 to bring the output voltage back to its desired level. As a result, both the amplifier bias voltage part of the filter as well as the feedback loops cooperate to produce a predetermined constant output voltage.

Normal use for the electronic filter can be between the D.C. power supply for the B+ voltage of an amplifier, and the B+ terminal of the amplifier, pre amplifier, power amplifier, and any other type of amplifier, especially for high fidelity sound system. The input voltage for such a filter would typically range from 475 to 570 VDC, and the output voltage across terminal 13 would be around 450 VDC at 0 to 100 ma. However, by adjusting potentiometer 19, the level of the output voltage can be changed.

An example of an amplifier for amplifier 24 is one sold by Motorola under the chip number MC 1566L, MC 1466L. When using this amplifier, pin numbers 2 and 3 would serve as the negative and positive feedback inputs, respectively, with pin number 6 serving as the amplifier output. Pin numbers 7 and 4 would serve as the positive and negative bias voltage terminals.

The following is a list of possible values for some of the circuit elements, which are listed only as an example:

| | |
|---|---|
| Resistor 17 | 4.7 ohms |
| Resistor 18 | 3.9 Kohms |
| Potentiometer 19 | 20 Kohms |
| Resistor 20 | 390 Kohms |
| Zener diode 21 | 10 volts |
| Capacitor 22 | 1 microfarad |
| Resistor 23 | 50 Kohms |
| Zener diodes 25,26 | 100 volts |
| Resistor 31 | 390 ohms |
| Zener diode 32 | 6 volts |
| Resistor 33 | 47K volts |
| Zener diode 34 | 30 volts |
| Resistor 35 | 150 Kohms |
| Capacitor 36 | 0.1 microfarad |

While a preferred embodiment of the invention has been shown and described, it is obvious that there are various modifications which will be readily apparent to those skilled in the art. It is the intent of the appending claims to cover those variations of the invention which are within the spirit and scope of the invention.

The invention claimed is:

1. An electronic filter for eliminating alternating current components from a direct current power supply and for continuously producing a direct current potential at its output with a predetermined value, regardless of the change in load across the output of the filter, wherein said filter comprises:

a. amplifier means having negative and positive input channels;

b. first feedback loop connected from the filter output to the negative input channel of the amplifier means;

c. second feedback loop connected from the filter output to the positive input channel of the amplifier means, said second feedback loop having greater resistance than the first feedback loop so that the combination of the signals received on the input channels is always negative, and the amplifier remains stable;

d. means, responsive to the output of the amplifier means, for controlling the current flowing from the filter input to the filter output, whereby the output voltage of the filter is controlled in response to the potential difference between the two feedback loops;

e. means for providing positive and negative bias voltage for the amplifier means; and f. means, responsive to the filter output voltage, for varying the providing means so that the positive bias voltage for the amplifier is related to the filter output voltage.

2. The electronic filter recited in claim 1, wherein the varying means comprises a zener diode connected between the positive bias voltage terminal for the amplifier means and the filter output to always maintain the positive bias voltage a predetermined amount greater than the filter output voltage.

3. The electronic filter recited in claim 2, wherein the bias voltage providing means receives its power solely from the input of the filter.

4. The electronic filter recited in claim 3, wherein the bias voltage providing means includes means for generating current for the amplifier from the filter input.

5. The electronic filter recited in claim 4, wherein the generating means includes a transistor connected as a current source.

6. The electronic filter recited in claim 5, wherein the first feedback loop comprises a zener diode in parallel with a capacitor.

7. The electronic filter recited in claim 6, wherein the controlling means comprises a transistor.

* * * * *